(12) United States Patent
Simon

(10) Patent No.: US 7,169,363 B2
(45) Date of Patent: Jan. 30, 2007

(54) APPARATUS AND METHOD FOR SEQUESTERING A CONTAMINANT BY USE OF AN EXOTHERMICALLY REACTIVE STRUCTURE

(75) Inventor: Jonathan Simon, Castro Valley, CA (US)

(73) Assignee: Avago Technologies General IP (Singapore) Pte. Ltd. (SG)

( * ) Notice: Subject to any disclaimer, the term of this patent is extended or adjusted under 35 U.S.C. 154(b) by 318 days.

(21) Appl. No.: 10/232,489

(22) Filed: Aug. 30, 2002

(65) Prior Publication Data

US 2004/0040578 A1    Mar. 4, 2004

(51) Int. Cl.
*B01D 50/00*  (2006.01)
*H01J 29/94*  (2006.01)

(52) U.S. Cl. ........................ 422/168; 313/481
(58) Field of Classification Search ........ 422/168–171, 422/177; 257/81, 682, 678, 798; 417/48–49, 417/51; 313/477 R, 422, 481, 495, 546, 313/547, 549, 553, 558, 561
See application file for complete search history.

(56) References Cited

U.S. PATENT DOCUMENTS

| | | | |
|---|---|---|---|
| 3,385,420 A | 5/1968 | Porta | |
| 5,538,795 A | 7/1996 | Barbee, Jr. et al. | |
| 5,866,978 A | 2/1999 | Jones et al. | |
| 5,929,515 A | 7/1999 | Greiff et al. | |
| 6,147,450 A * | 11/2000 | Fritz et al. | ........... 313/495 |
| 6,203,869 B1 | 3/2001 | Dougherty et al. | |
| 2001/0038029 A1 | 11/2001 | Weihs et al. | |
| 2001/0046597 A1 | 11/2001 | Weihs et al. | |
| 2002/0037633 A1 | 3/2002 | Satou et al. | |

FOREIGN PATENT DOCUMENTS

| WO | WO 97/11905 | 4/1997 |
|---|---|---|
| WO | WO 01/08191 | 2/2001 |
| WO | WO 02/10846 | 2/2002 |

\* cited by examiner

*Primary Examiner*—Glenn Caldarola
*Assistant Examiner*—Tom P. Duong

(57) ABSTRACT

A method of contaminant sequestering. Specifically, one embodiment of the present invention discloses an apparatus for sequestering a contaminant comprising an exothermically reactive structure disposed within a hermetic enclosure. A sorbent material coats a surface of the exothermically reactive structure. The sorbent material reacts with a contaminant contained within an atmosphere of the hermetic enclosure when exposed to heat from an exothermic alloying reaction in the exothermically reactive structure. As such, the contaminant becomes sequestered within the hermetic enclosure.

20 Claims, 6 Drawing Sheets

300

APPARATUS AND METHOD FOR SEQUESTERING A CONTAMINANT BY USE OF AN EXOTHERMICALLY REACTIVE STRUCTURE

TECHNICAL FIELD

The present claimed invention relates to the field of contamination removal in hermetic enclosures. More specifically, the present claimed invention relates to the sequestering of contaminants within a hermetic enclosure using an exothermically reactive structure.

BACKGROUND ART

Hermetic sealing of an enclosure is often desired to maintain a contaminant-free or low contaminant environment. A contaminant-free or low contaminant environment may be necessary for operation of particular devices. That is, contamination within a hermetic enclosure or package can lead to premature failure of the various enclosed components.

Corrosive effects due to the presence of oxygen, moisture, and other oxygen releasing species can pose a problem in microelectronic circuitry. Wire bonding of microelectronic components to the packaging may involve the use of aluminum within the wire bonds. Oxidation of the aluminum wire pads due to the presence of oxygen leads to the corrosion of the wire pads. For example, in the presence of moisture, the oxidation reaction of aluminum can proceed until the exposed aluminum is completely reacted or corroded. Such oxidation can ultimately lead to the failure of the microelectronic component. As such, it is desirable to reduce the presence of oxygen, moisture, or other oxygen releasing species in a hermetic enclosure.

In addition, potential corrosive effects may occur due to the presence of other damaging elements. For example, active device functions can be deleteriously affected by the presence of hydrogen. Water in the presence of sodium can supply hydrogen atoms which diffuse through the passivating layer(s) of a semiconductor affecting the performance of the semiconductor component. Component failure may be due to increased leakage currents, failure of field emission transistors (FETs) to enhance or deplete properly, etc.

One solution is to provide a getter material to remove and sequester contaminants (e.g., oxygen, moisture, or other oxygen releasing species, etc.) within a hermetic enclosure. Such gettering is conventionally performed by globally elevating the hermetic enclosure beyond a threshold temperature necessary to initiate a gettering reaction. However, elevating the entire hermetic enclosure may unnecessarily and deleteriously affect the circuitry of the components contained within the hermetic enclosure.

Thus, a need exists for an apparatus and method for sequestering a contaminant within a hermetic enclosure without damaging circuitry within the hermetic enclosure. A further need exists for an apparatus and method which meets the above need and prevents corrosion due to oxidation within the hermetic enclosure. Another need exists for an apparatus and method which meets the above needs and which provides for the lifetime extension of the enclosed components.

DISCLOSURE OF THE INVENTION

An apparatus and method of contaminant removal is disclosed. Specifically, embodiments of the present invention disclose a method and apparatus for sequestering a contaminant comprising an exothermically reactive structure adapted to be disposed within a hermetic enclosure. A sorbent material is activated when exposed to heat from a exothermic reaction. The sorbent material can catalytically and non-catalytically react with a contaminant contained within an atmosphere of the hermetic enclosure when exposed to heat from an exothermic alloying reaction in the exothermically reactive structure. As such, the contaminant becomes sequestered within the hermetic enclosure.

These and other technical features of the present invention will no doubt become obvious to those of ordinary skill in the art after having read the following detailed description of the embodiments which are illustrated in the various drawing figures.

BRIEF DESCRIPTION OF THE DRAWINGS

The accompanying drawings, which are incorporated in and form a part of this specification, illustrate embodiments of the invention, and together with the description, serve to explain the principles of the invention.

DETAILED DESCRIPTION OF THE INVENTION

Reference will now be made in detail to embodiments of the present invention, an apparatus and method for sequestering a contaminant within a hermetic enclosure using an exothermically reactive structure, examples of which are illustrated in the accompanying drawings. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
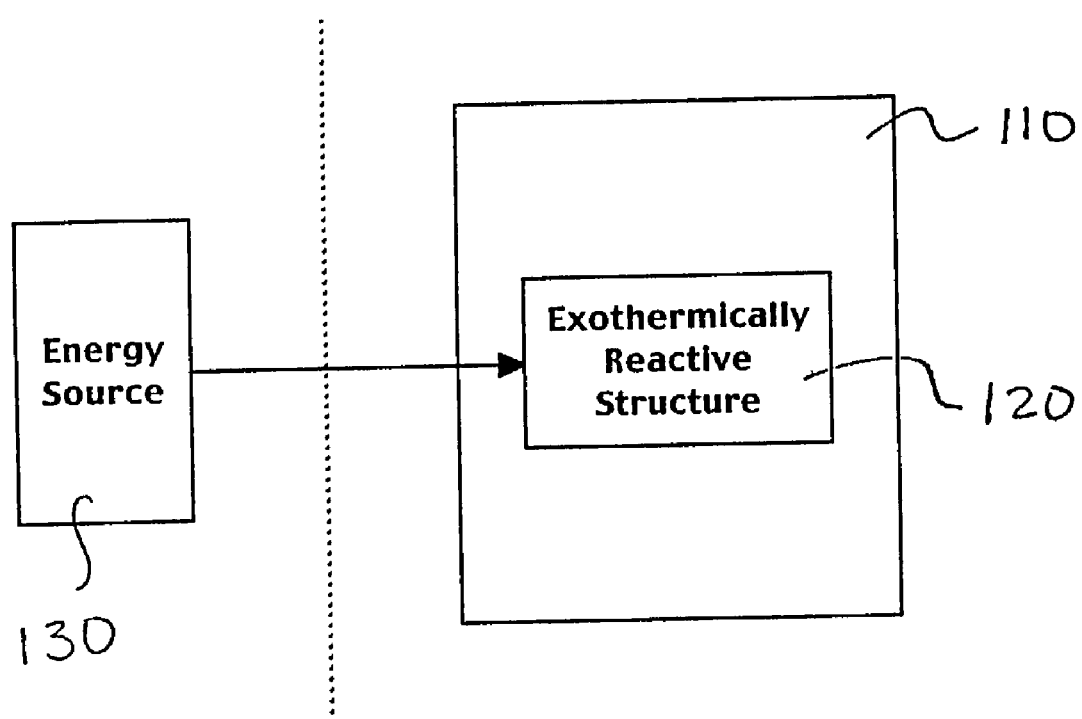
FIG. 1 is a block diagram illustrating a microelectronic circuit within a hermetic enclosure that contains a sorbent material for sequestering contaminants within the hermetic enclosure, in accordance with one embodiment of the present invention.

FIG. 1 is a schematic diagram illustrating a system 100 capable of sequestering contaminants through the use of an exothermically reactive structure 120. More specifically, system 100 includes a hermetic enclosure 110. The hermetic enclosure 110, also referred to as a package can be suitably sized, for example, to contain microelectronic components. The microelectronic components is integrated into a semiconductor substrate, in one embodiment. For purposes of clarity, the system 100 does not show the microelectronic components; however, it is to be understood that the hermetic enclosure protects and seals the microelectronic components within an ambient atmosphere. Although such an example is provided above, the present invention is well suited to use with enclosures containing various sizes of electronic components, and other devices suitable for packaging, other than microelectronic components.

Contained within the hermetic enclosure 110 is an exothermically reactive structure 120. The hermetic enclosure 110 may contain contaminants (e.g., trace oxygen or water vapor, as well as other harmful elements and compounds) that may over time prematurely degrade the performance of the microelectronic components.

As will be discussed below, the exothermically reactive structure, when activated, produces localized heating for initiating a second reaction that sequesters the contaminants within the hermetic enclosure. The exothermically reactive structure is comprised of certain metals. These metals, when placed in contact, and initiated with energy, e.g., a threshold amount of heat, can be capable of alloying reactions that are highly exothermic.

An energy source 130 is available outside the hermetic enclosure 110 in order to initiate the exothermic reaction produced from the metals of the exothermically reactive structure 120. To list a few, as will be discussed further, the outside energy source 130 can be a laser for providing localized heating, a current source for providing localized heating, or an oven for providing bulk, or global, heating of the hermetic enclosure 110.

Figure 2:
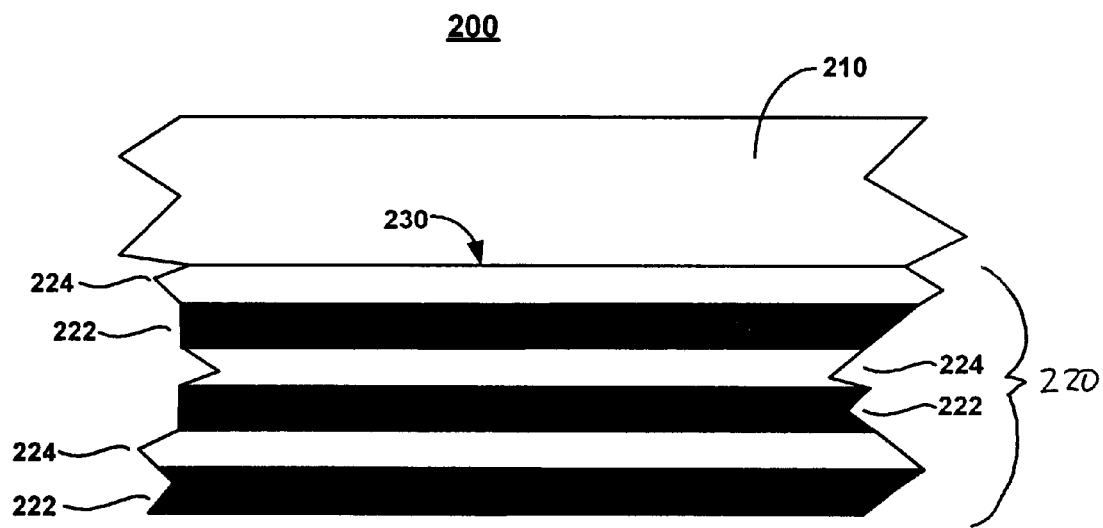
FIG. 2 is a diagram illustrating a cross section of an exothermically reactive structure and a separate sorbent material for sequestering contaminants, in accordance with one embodiment of the present invention.

FIG. 2 is a diagram illustrating a cross section of a structure 200 used for removing contaminants within a hermetic enclosure, in one embodiment of the present invention. The structure 200 can be in the form of a strip, pad, roll or any suitable shape and size to ensure the initiation and propagation of an exothermic reaction throughout the structure 200, and to fit within the hermetic enclosure.

The structure 200 includes an exothermically reactive material 220 that is disposed within the hermetic enclosure (not shown). In one embodiment, the exothermically reactive material 220 contains thin films of alternating layers of metals. The thin films or layers of metals are of submicron thickness and are deposited onto the preceding metal layer. For example, FIG. 2 illustrates a first layer 222 alternating with a second layer 224 to form the exothermically reactive material 220. In another embodiment, the thin films or layers are of a thin foil structure comprising multiple layers of a plurality of reactive metal layers that are chemical elements.

The metals contained within the first layer 222 and the second layer 224 contain metals that when placed in contact, and initiated with an amount of heat, or other forms of energy, exceeding a certain threshold, is capable of an alloying reaction that is highly exothermic. In one instance, nickel is the metal placed in the first layer 222, and aluminum is the metal placed within the second layer 224. Other well known and varying combinations of metals can also be deposited to form the exothermically reactive material 220.

The exothermically reactive material 220 is a multilayer structure that can vary in the number and type of layers. For example, two or more layers of metal can be combined to create the exothermically reactive material 220. In addition, two or more types of metal layers can be used to form the exothermically reactive material 220. Various layering combinations of the metals can be implemented to form the exothermically reactive material 220. By way of illustration, FIG. 2 illustrates an alternating layer construction whereby the multilayer structure 220 is formed by alternating two or more metal layers (e.g., metal layer 222 and metal layer 224).

The structure 200 also includes a sorbent material 210 disposed on a surface 230 of the exothermically reactive material 220. In another embodiment, the sorbent material coats a non-planar surface of the exothermically reactive structure. The sorbent material is used for sequestering a contaminant contained within an atmosphere of the hermetic enclosure. The sorbent material, when activated, chemically sorbs gases, through adsorption or absorption, in the atmosphere of the hermetic enclosure. Activation occurs when the sorbent material is exposed to heat created from an exothermic alloying reaction in the exothermically reactive material 220.

In one embodiment, the sorbent material is a getter material. The getter material may use one or more different reactions, such as, adsorption, absorption, oxidation/reduction reaction, etc., to separate the undesired constituent from a gaseous mixture within the hermetic enclosure. In one embodiment, the getter consists of a highly porous and mechanically stable component that is subsequently activated to sequester the contaminants within a hermetic enclosure. The getter material is intended to capture and sequester contaminants remaining in the atmosphere after the hermetic enclosure has been sealed, in one embodiment. The getter material is activated before the operation of the electronic components contained within the hermetic enclosure, in one embodiment.

The getter material is also intended to capture and sequester contaminants which are released during operation of the components (e.g., microelectronic components) within the hermetic enclosure, e.g., released during the higher operating temperatures, in another embodiment. As such, the getter material is activated after the operation of the electronic components contained within the hermetic enclosure.

Contaminants can include oxygen, water moisture, other oxygen releasing compounds, and other elements, such as hydrogen, that adversely affect the structure and operation of the various components located within the hermetic enclosure. Embodiments of the present invention are able to sequester contaminants that are in gaseous or vaporous states.

In one embodiment, the getter material non-catalytically reacts with the contaminant in order to sequester the contaminant. For purposes of the present invention, a non-catalytic reaction is defined as a reaction which forms compounds with the contaminants. For example the getter material can be thorium, barium, or zirconium which have an affinity for forming compounds with oxygen or other gases, when activated by the elevated temperatures created from the exothermic alloying reaction in the exothermically reactive material 220.

In another embodiment, instead of a getter material, the sorbent material 210 is a catalyzing agent for sequestering the contaminant (e.g., oxygen, hydrogen, etc.) contained within the atmosphere of the hermetic enclosure. For purposes of the present invention, the catalyzing agent helps to bring about the sequestering of the contaminant without necessarily forming a separate and resulting chemical product from a reaction. For example, the sorbent material 210 adsorbs the contaminant into its surface in order to sequester the contaminant within the hermetic enclosure. Additionally, the sorbent material 210 can reform the contaminant gases into a harmless gaseous compound through reaction. In one embodiment, the sorbent material that acts as catalyzing agent is platinum or zirconium.

Figure 3:
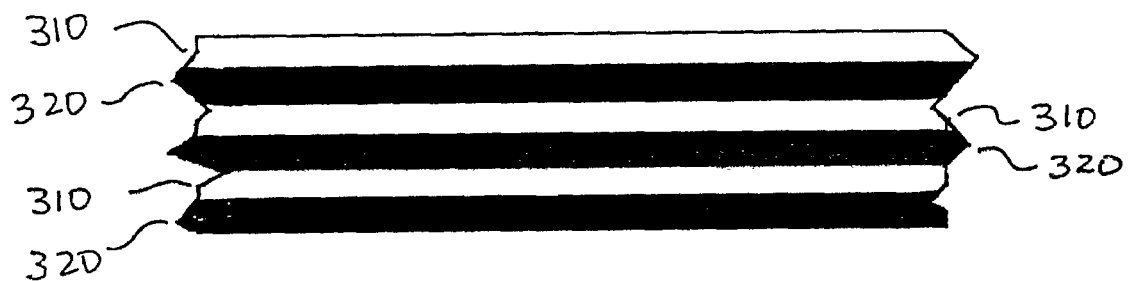
FIG. 3 is a diagram illustrating a cross section of an exothermically reactive structure comprising a sorbent material for sequestering contaminants, in accordance with one embodiment of the present invention.

FIG. 3 is a diagram illustrating a cross section of an exothermically reactive structure 300 used for removing contaminants, as previously listed, within a hermetic enclosure, in one embodiment of the present invention. The exothermically reactive structure 300 can be in the form of a strip, pad, or any suitable shape and size to ensure the initiation and continuation of an exothermic reaction throughout the structure 300, and to fit within the hermetic enclosure.

The exothermically reactive structure 300 is disposed within the hermetic enclosure (not shown). As in FIG. 2, the structure 300 is comprised of exothermically reactive metal layers that when activated, produces localized heating. These metals, when placed in contact, and initiated with energy, e.g., a threshold amount of heat, can be capable of alloying reactions that are highly exothermic.

The exothermically reactive structure 300 contains thin films of alternating layers of metals, in one embodiment. The thin films or layers of metals are of submicron thickness and are deposited onto the preceding metal layer. For example, FIG. 3 illustrates a first layer 310 alternating with a second layer 320 to form the exothermically reactive structure 300.

In addition, one of the thin films or layers of metals (e.g., layer 310) comprises a metal that is also a sorbent material. The sorbent material in layer 310, when activated, sequesters a contaminant contained within the atmosphere of the hermetic enclosure. The sorbent material in layer 310, when activated, chemically sorbs contaminant gases, through adsorption or absorption, in the atmosphere of the hermetic enclosure. Activation occurs when the sorbent material is exposed to heat created from an exothermic alloying reaction in the exothermically reactive material or structure 300. As such, the sorbent material in layer 310 is one reactant in the exothermic alloying reaction, and also provides for the reaction or processes to sequester the contaminant within the atmosphere of the hermetic enclosure.

As in the discussion for FIG. 2, the sorbent material of FIG. 3 disposed in layer 310 is a getter material, in one embodiment of the present invention. The getter material non-catalytically reacts with the contaminants for sequestering those contaminants within the hermetic enclosure. As previously discussed, the getter material can be thorium, barium, or zirconium which have an affinity for forming compounds with oxygen or other gases, when activated by the elevated temperatures created from the exothermic alloying reaction in the exothermically reactive material 220.

In another embodiment, the sorbent material in layer 310 is a catalyzing agent for sequestering the contaminant (e.g., oxygen, hydrogen, etc.) contained within the atmosphere of the hermetic enclosure. As such, the sorbent material in layer 310 adsorbs the contaminant into its surface in order to sequester the contaminant within the hermetic enclosure. Additionally, the sorbent material in layer 310 can reform the contaminant gases into a harmless gaseous compound through reaction. As previously discussed, the sorbent material that acts as catalyzing agent is platinum or zirconium.

Figure 4:
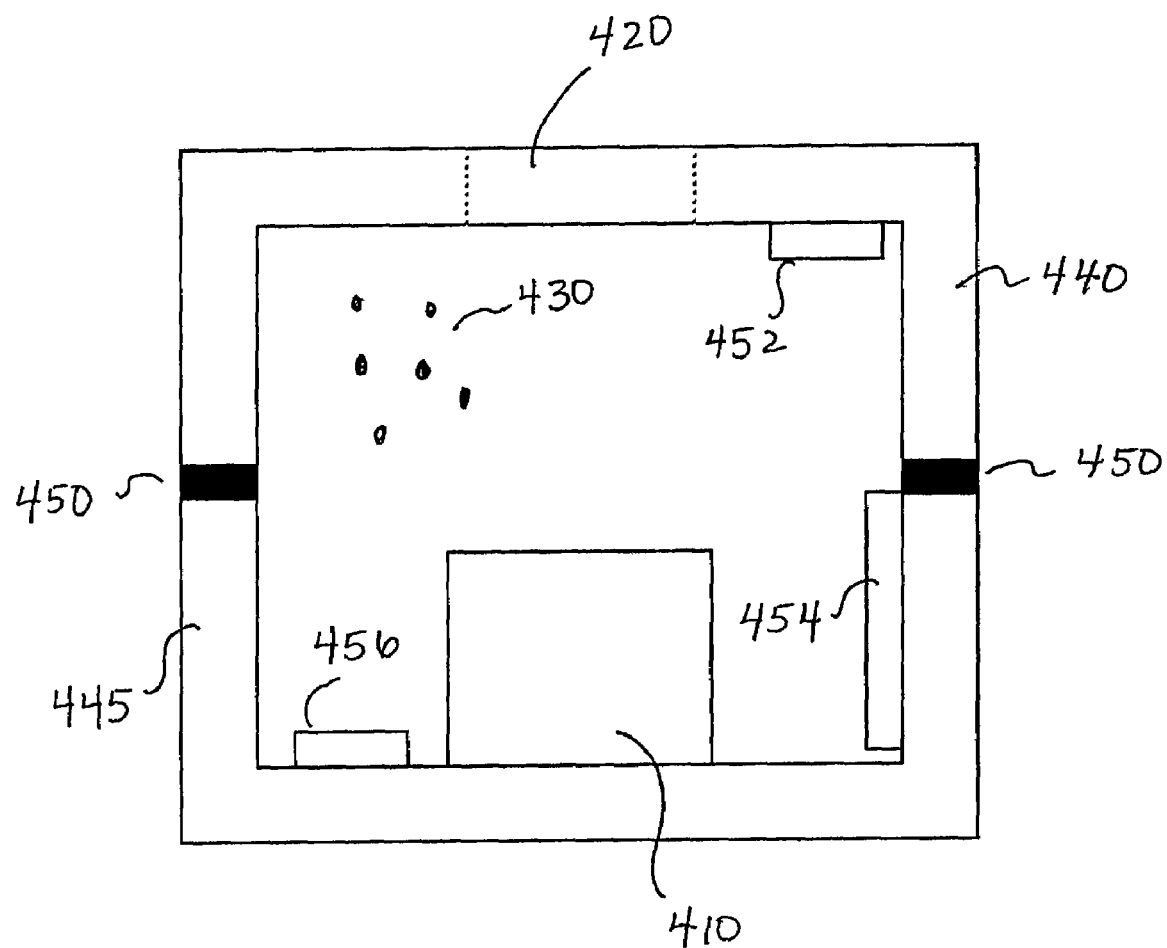
FIG. 4 is a cross section of a hermetic enclosure containing exothermically reactive structures for initiating a reaction with a sorbent material for sequestering a contaminant within the hermetic enclosure, in accordance with one embodiment of the present invention.

FIG. 4 is a diagram of a cross section of a hermetic enclosure 400 that contains a microelectronic component 410, in one embodiment of the present invention. The hermetic enclosure 400 comprises a wall 440 that forms a top part of the hermetic enclosure 400. A wall 445 comprises a bottom part of the hermetic enclosure 400. Bonding regions 450 are sealed after the interior of the enclosure 400 defined by the walls 440 and 445 is evacuated and/or flooded with an inert gas. The hermetic enclosure 400 may have been sealed by any method operating at temperatures lower than a threshold temperature needed for initiating the exothermic alloying reaction.

As shown in FIG. 4, even after hermetically sealing the hermetic enclosure 400, contaminants 430 may be present. These contaminants 430 may be oxygen, water moisture, other oxygen releasing species, or other harmful elements that prematurely degrade performance of the microelectronic component 410.

Variously sized structures containing sequestering material are disposed within the hermetic enclosure 400 in order to provide for the sequestering of the contaminants 430. Although embodiments of the present invention describe the structures in the form of strips or pads, they can take on various shapes and sizes to fit within the hermetic enclosure 400. These strips or pads of structures can be the structures shown in FIGS. 2 and 3.

As shown in FIG. 4, multiple strips or pads can of varying shapes and sizes can be disposed within the hermetic enclosure 400. For example, pad 452 is disposed on wall 440, whereas, pads 456 and 454 are disposed on wall 445. In one embodiment, each of the strips or pads that contain sequestering materials are activated independently of each other at different times. As such, one or more of the pads 452, 454, and 456 can be activated after the hermetic enclosure has been exposed to elevated temperatures (e.g., operating temperatures). In this way, harmful contaminants that are released only at the elevated temperatures can be sequestered.

An outside energy source (e.g., energy source 130) provides the threshold amount of heat or energy to initiate the alloying reaction that is highly exothermic in each of the strips or pads 452, 454, and 456. In one embodiment, the energy source can be provided in the form of localized heating through the use of a laser and its beam of focused energy, in one instance. The laser beam can be focused onto the pads 452, 454, and 456 through the optional optical window 420. In another embodiment, the energy source is provided in the form of bulk heating of the entire hermetic enclosure 400.

Figure 5:
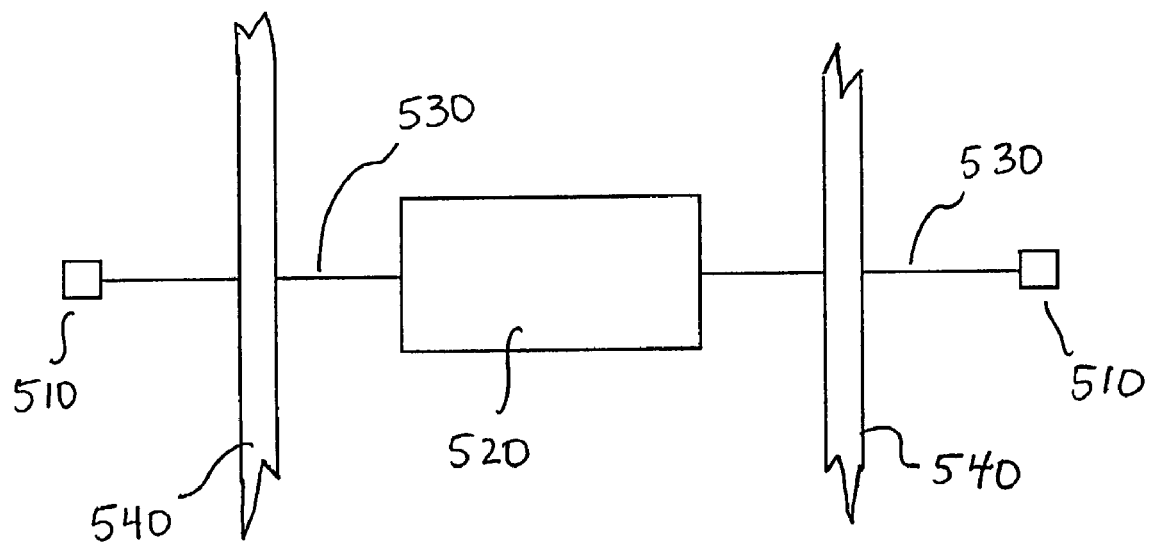
FIG. 5 is a cross section of a resistive element comprising an exothermically reactive structure for initiating a reaction with a sorbent material for sequestering a contaminate within a hermetic enclosure, in accordance with one embodiment of the present invention.

FIG. 5 illustrates a cross section of a resistive element 520 comprising an exothermically reactive structure, in one embodiment of the present invention. The exothermically reactive structure, once initiated, activates a reaction with a sorbent material for sequestering a contaminant within a hermetic enclosure that is partly defined by walls 540.

The resistive element 520 comprises the exothermically reactive structures and sorbent materials as found in FIGS. 2 and 3, and is patterned into a resistive element 520. The resistive element 520 is fabricated with electrical contacts 510 that are outside the hermetic enclosure that is partly defined by the walls 540. Conductive leads 530 from the electrical contacts are coupled to the resistive element 520. A small current from an outside energy source (e.g., energy source 130) is passed through the resistive element 520. The outside energy source is coupled to the electrical contacts 510. The current causes the resistive element 520 to heat up, which in turn initiates the exothermic alloying reaction, thereby releasing heat. In turn, the heat activates the sorbent material patterned on the resistive element 520 and sequesters the undesirable gases in the subsequent catalytic or non-catalytic reaction.

In another embodiment, the exothermically reactive structures and sorbent materials as found in FIGS. 2 and 3 are disposed on top of the resistive element 520 found in FIG. 5. Again, a current from an outside energy source is passed through the resistive element, and heats the resistive element. The heat provided initiates the exothermic alloying reaction between materials in the exothermically reactive structure. Further heat is released in the exothermic alloying reaction, thereby activating the sorbent material that is disposed on the resistive element 520.

Figure 6:
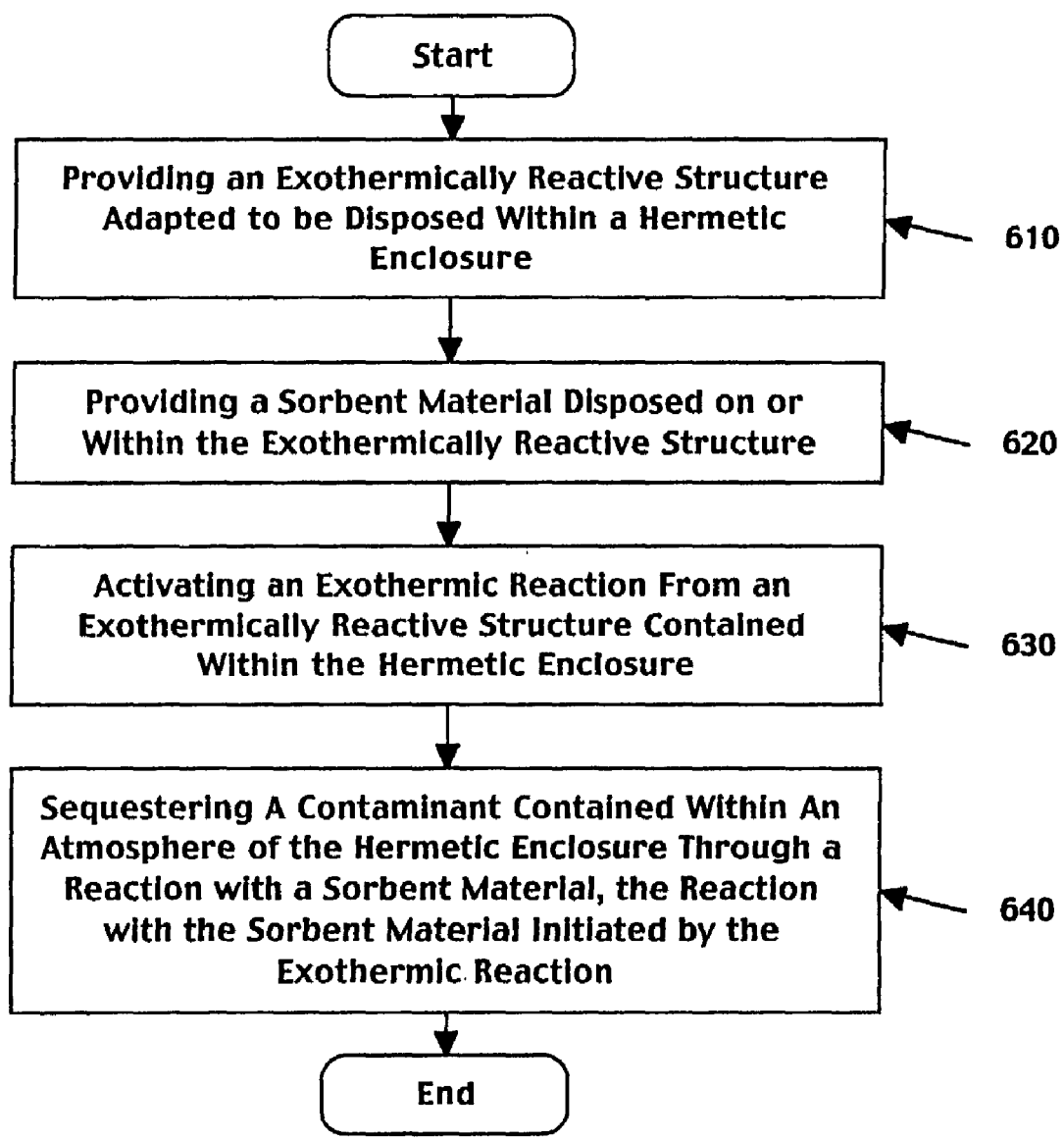
FIG. 6 is a flow diagram illustrating steps in a method of sequestering a contaminant within a hermetic enclosure, in accordance with one embodiment of the present invention.

FIG. 6 is a flow chart illustrating steps in a method for removing contaminants within a hermetic enclosure, in accordance with one embodiment of the present invention. In step 610, the present embodiment provides an exothermically reactive structure, which are exemplified in FIGS. 2 and 3. The exothermically reactive structure, when activated, generates heat from an exothermic alloying reaction between the metal layers of the exothermically reactive structure.

The exothermically reactive structures are contained within a hermetic enclosure, in one embodiment. The hermetic enclosure is suitably sized for containing at least one microelectronic component. Disposed within the hermetic enclosure is an exothermically reactive structure.

In step 620, the present embodiment provides a sorbent material. In one embodiment, the sorbent material is disposed on the exothermically reactive structure. In another embodiment, the sorbent material is disposed within the exothermically reactive structure, and is one of the reactants in the exothermic reaction. As previously discussed, the sorbent material, when activated chemically sorbs contaminant gases, through adsorption or absorption. Activation occurs when the sorbent material is exposed to heat.

In step 630, the present embodiment activates an exothermic reaction from the exothermically reactive structure contained within the hermetic enclosure. The exothermically reactive structure, when activated, produces localized heating from the subsequent exothermic alloying reaction between metal layers in the exothermically reactive structure.

In step 640, the present embodiment sequesters a contaminant contained within an atmosphere of the hermetic enclosure through a reaction with the sorbent material. The reaction is initiated by the exothermic reaction, as previously discussed. The sorbent material is disposed on a surface of the exothermically reactive structure, in one embodiment, or may disposed within the exothermically reactive structure, in another embodiment.

As previously discussed, the sorbent material is a getter material for non-catalytically reacting with the contaminant for the sequestering the contaminant, in one embodiment. In addition, the sorbent material can be a catalyzing agent for sequestering the contaminant, in another embodiment.

In still another embodiment, the hermetic enclosure is raised to a temperature sufficient to release the contaminants. The temperature can be associated with operating temperatures experienced by the hermetic enclosure, such as those created by operating a microelectronic device enclosed within the hermetic enclosure. The hermetic enclosure is raised to a temperature without initiating the exothermic reaction, and is performed before initiating the exothermic reaction. In this way, contaminants released at the elevated temperatures can be later sequestered by initiating one or more exothermic reactions that activate sorbent materials.

Embodiments of the present invention, an apparatus and method for sequestering a contaminant within a hermetic enclosure using an exothermically reactive structure, is thus described. While the present invention has been described in particular embodiments, it should be appreciated that the present invention should not be construed as limited by such embodiments, but rather construed according to the below claims.

What is claimed is:

1. An apparatus for removing contaminants comprising:
an exothermically reactive structure adapted to be disposed within a hermetic enclosure, wherein said exothermically reactive structure comprises alternating layers of submicron films of metals for producing an exothermic alloying reaction when activated; in which
at least one of said alternating layers, a first alternating layer, comprises a sorbent material comprising one reactant in said exothermic alloying reaction and for sequestering a contaminant contained within an atmosphere of said hermetic enclosure when exposed to heat from said exothermic alloying reaction, wherein said first alternating layer exothermically reacts with a second alternating layer that does not exhibit any sorbent characteristics.

2. The apparatus of claim 1, wherein said sorbent material is a getter material for non-catalytically reacting with said contaminant for sequestering said contaminant.

3. The apparatus of claim 2, wherein said getter material is selected from the group consisting of:
barium;
thorium, and
zirconium.

4. The apparatus of claim 1, wherein said sorbent material is a catalyzing agent for sequestering said contaminant.

5. The apparatus of claim 4, wherein said sorbent material is taken from a group consisting of:
platinum; and
zirconium.

6. The apparatus of claim 1, further comprising:
an external energy source for initiating said exothermic alloying reaction.

7. The apparatus of claim 6, wherein said external energy source is a laser for initiating said exothermic alloying reaction in a localized area of said exothermically reactive structure.

8. The apparatus of claim 6, wherein said external energy source thermally heats said hermetic enclosure for initiating said exothermic alloying reaction.

9. The apparatus of claim 1, wherein said sorbent material comprises an absorbing getter material for sequestering said contaminant.

10. The apparatus of claim 1, wherein said sorbent material comprises an adsorbing getter material for sequestering said contaminant.

11. The apparatus of claim 1, wherein said exothermically reactive structure and said sorbent material are patterned into a resistive element.

12. An apparatus for removing contaminants comprising:
first and third layers of an alloying metal, wherein said alloying metal does not exhibit any sorbent characteristics; and
a second layer of a sorbent material sandwiched between said first and third layers for reacting with each of said first and third layers of said alloying metal in an exothermic alloying reaction, and for sequestering a contaminant contained within an atmosphere of a hermetic enclosure when said sorbent material is exposed to heat from said exothermic alloying reaction, said first, second, and third layers comprising an exothermically reactive structure adapted to be disposed within said hermetic enclosure, wherein said first, second, and third layers comprise alternating layers of submicron thickness.

13. The apparatus as described in claim 12, wherein said sorbent material is a getter material for non-catalytically reacting with said contaminant for sequestering said contaminant.

14. The apparatus of claim 13, wherein said sorbent material, is selected from a group consisting of:
barium;
thorium; and
zirconium.

15. The apparatus as described in claim 12, wherein said sorbent material acts as a catalyzing agent for sequestering said contaminant.

16. The apparatus as described in claim 15, wherein said sorbent material is taken from a group consisting of:
platinum; and
zirconium.

17. The apparatus as described in claim 12, further comprising:
an external energy source for activating said exothermic alloying reaction.

18. The apparatus of claim 17, further comprising a resistive element, said resistive element comprising
said exothermically reactive structure; and
electrical contacts coupled to said exothermically reactive structure, said electrical contacts extending outside said hermetic enclosure and coupled to said external energy source that heats said exothermically reactive structure with current for activating said exothermic alloying reaction.

19. The apparatus as described in claim 12, further comprising said hermetic enclosure, and wherein said hermetic enclosure is suitably sized to enclose at least one microelectronic device.

20. The apparatus of claim 17, wherein said external energy source is a laser for initiating said exothermic alloying reaction in a localized area of said exothermically reactive structure.

* * * * *